(12) United States Patent
Sakao

(10) Patent No.: US 6,229,170 B1
(45) Date of Patent: May 8, 2001

(54) SEMICONDUCTOR MEMORY CELL

(75) Inventor: Masato Sakao, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/280,695

(22) Filed: Mar. 30, 1999

(30) Foreign Application Priority Data

Apr. 1, 1998 (JP) .................................................. 10-088924

(51) Int. Cl.[7] .......................... H01L 27/108; H01L 29/76; H01L 29/94; H01L 31/119
(52) U.S. Cl. ........................ 257/296; 257/306; 257/905; 257/907
(58) Field of Search ..................................... 257/296–212, 257/905–907; 438/396–399, 250–253

(56) References Cited

U.S. PATENT DOCUMENTS

| | | | |
|---|---|---|---|
| 5,383,151 | * | 1/1995 | Onishi et al. .......................... 257/905 |
| 5,604,365 | * | 2/1997 | Kajigaya et al. ...................... 257/296 |
| 5,691,223 | * | 11/1997 | Pittikoun et al. ...................... 438/253 |
| 5,748,521 | * | 5/1998 | Lee ........................................ 257/306 |

FOREIGN PATENT DOCUMENTS

| | | |
|---|---|---|
| 4-049656 | 2/1992 | (JP) . |
| 4-307968 | 10/1992 | (JP) . |
| 7-066297 | 3/1995 | (JP) . |
| 9-121036 | 5/1997 | (JP) . |
| 9-181273 | 7/1997 | (JP) . |

OTHER PUBLICATIONS

T. Ema et al., "3–Dimensional Stacked Capacitor Cell for 16M DRAMS", (International Electron Device Meeting), Technical Digest, 1988, pp. 592–595 with Abstract. Month Unavailable.

S. Kimura et al., "A New Stacked Capacitor DRAM Cell Charcteraized by a Storage Capacitor on a Bit–line Structure", (International Electron Device Meeting), Technical Digest, 1988, pp. 596–599 with Abstract. Month Unavailable.

Y. Nishioka et al., "Giga–bit Scale DRAM Cell with New Simple Ru/(Ba,Sr)Ti$_3$/Ru Stacked Capacitors Using X–Ray Lithography", (International Electron Device Meeting), Technical Digest, 1995, pp. 903–906 with Abstract. Month Unavailable.

* cited by examiner

*Primary Examiner*—Tom Thomas
*Assistant Examiner*—Cuong Quang Nguyen
(74) *Attorney, Agent, or Firm*—Sughrue, Mion, Zinn, Macpeak & Seas, PLLC

(57) ABSTRACT

A pair of semiconductor memory cells comprises active regions having rectangular shapes, arranged in uniform intervals in plan view, said active regions constituting channel regions and source/drain regions of switching transistors; word lines arranged so as to be perpendicular to the active regions; and an extraction electrode connected to a bit line through bit a line contact formed in connection to the active regions constituting the pair of switching transistors.

6 Claims, 7 Drawing Sheets

SEMICONDUCTOR MEMORY CELL

BACKGROUND OF THE INVENTION

1. Field of the Invention

The present invention relates to a semiconductor memory cell having a pair of switching transistors, each of which is connected to a bit line through a bit line contact.

2. Description of the Related Art

A memory unit of a dynamic Random Access Memory (hereinafter, referred to as a DRAM) is composed of one MOS transistor (hereinafter, referred to as switching transistor) 401 and one capacitor (hereinafter, referred to as capacitor ) 402, as shown in FIG. 1. A gate of switching transistor 401 is connected to word line 404, and source and drain thereof are connected to bit line 403. Stored data is stored in capacitor 402 as a charge, and data is stored or discharged in/from capacitor 402 depending on switching ON/OFF of switching transistor 401.

The charge stored/discharged in/from capacitor 402 is interchanged between capacitor 402 and an external circuit through bit line 403 which is connected to the opposite side of switching transistor 401 to capacitor 402. A signal for determining ON/OFF of switching transistor 401 is supplied to switching transistor 401 through word line 404 which is connected to the gate of switching transistor 401 or formed integrally with the gate thereof.

The DRAM is composed of one transistor and one capacitor as constitution components, and it has an excellent advantage that it can achieve a reduction in an area of the memory cell because of its small number of constitution components.

As downsizing of the memory cell and increasing of memory cell density thereof are promoted, the DRAM cell has been developed in its structure from a planar capacitor cell in which a capacitor is formed on a diffusion layer two-dimensionally to a stacked capacitor cell in which the capacitor is formed three-dimensionally on the word line. However, with further reduction of the cell area, as shown in FIG. 2A and FIG. 2B, shield bit line type stacked cell in which a capacitor is formed on bit line 485 is proposed in IEDM (International Electron Device Meeting) Technical Digest, pp. 592–595, 1988 and pp. 596–599, 1988.

In these structures, the capacitor is disposed in the uppermost layer thereof, and the bit line is disposed between the capacitor and the word line. Therefore, a contact for connection with other elements is never formed at the position of the capacitor element, an area occupied by the capacitor can be secured to the utmost limit, so that the DRAM takes a structure that is advantageous for securing a capacitance.

FIG. 2A and FIG. 2B illustrate, a plan view and a section view, respectively, of the conventional shield bit line type stacked cell, proposed in IEDM, pp 592–595, 1988.

FIG. 3 is a view showing an active region pattern alone in the plan view of FIG. 2A. As is apparent from FIG. 2B, in this conventional memory cell, an isolation method using a LOCOS (Local Oxidation of Silicon)-based selective oxidation technology is adopted for an isolation to define active region 480. However, in the isolation method using the LOCOS-based selective oxidation technology, a reduction in the active region due to a beak-shaped spread of an oxidized film, which is called a bird's beak, is caused. In manufacturing processes according to a design rule of 0.18 $\mu$m which corresponds to a DRAM class having a storage capacity of 1 giga bit, this bird's beak is a problem, and an edge of the pattern of active region 480 shown in FIG. 3 is narrowed.

More specifically described, since both ends of active region 480 are close to an activation region (another active region 480), it is impossible to widen an effective area of active region 480 after a selective oxidation, in so far as an area of the memory cell is not enlarged. For this reason, lower capacitor electrode contact 487 provided on active region 480 shown in FIG. 2B is not opened on active region 480, and an unsatisfactory conduction between lower capacitor electrode 488 and active region 480 may occur.

With respect to not only working for making the configuration of the memory cell but also an electric characteristic thereof, the isolation in the memory cell is insufficient by LOCOS-based isolation, so that the LOCOS-based isolation can not be applied to a DRAM in the 0.18 $\mu$m rule class.

As isolation method in such class, it has been known that a trench isolation is suitably adopted. However, the pattern of active region 480 shown in FIG. 3 takes a layout in which a wide separation space portion and a narrow separation space portion mixedly exist.

In such pattern layout, when an oxide film formed by a CVD method is filled also in a trench, which is formed by etching a silicon substrate, in order to form a trench isolation region, a problem occurs that although the wide isolation space portion is filled with the oxide film, the narrow isolation space portion is not perfectly filled with the oxide film. In other words, a gap portion in which the oxide film is not filled is produced in the narrow isolation portion.

Furthermore, when such trench isolation is applied to manufacture the memory cell, a memory cell for preventing the burying problem described above has been proposed. Hereinafter, a conventional layout for the memory cell will be described, in which it is tried to solve the burying problem by making the trench widths uniform in the memory cell. This is an example disclosed in IEDM, Technical Digest, pp 903–906, 1995.

FIG. 4 shows a pattern layout of the memory cell array portion of this example in which active region 280, word line 284, source/drain region 290a, 290b, and 290c are illustrated in the central region. When attention is paid to this active region 280, an interval between the active regions, that is, an interval to isolate the active regions, is seen to be constant. Therefore, as long as the foregoing arguments is considered from view of this point, the problem that the gap due to lack of uniformity of the foregoing isolation interval occurs in the buried oxide film for the trench isolation is removed.

However, FIG. 4 shows the example in which word line 284 is formed out of position with respect to active region 280. As is understood from this drawing, another problem occurs in such pattern layout. Specifically, slanted lines are partially drawn among source/drain regions 290a, 290b and 290c, and source/drain regions of switching transistors to be paired with each other are source/drain regions 290a and 290c, for source/drain region 290b which is connected with bit line contact 286. One switching transistor is composed of source/drain region 290a and source/drain region 290b, and another switching transistor is composed of source/drain region 290b and source/drain region 290c. With reference to channel widths of these two paired switching transistors, one of the channel widths is determined depending on a wider width portion of source/drain region 290b. The other is apparently equal to a thin portion of the channel of source/drain region 290b. Therefore, characteristics of the paired switching transistors are made to be unbalanced owing to a difference between the channel widths thereof.

In addition to the foregoing examples, there is an example of a layout pattern, disclosed in IEDM, Technical Digest, pp.

297–299, 1994, in which the interval of the isolation regions are made to be uniform, thus allowing them to avoid the burying problem of a isolation oxide film.

FIG. 5 shows a layout pattern of the memory cell array portion of this example, in which active region 380, word line 384 and source/drain regions 390a, 390b and 390c are drawn as main subjects. In this active region 380, an interval of an isolation is constant. Furthermore, in FIG. 5, slanted lines are drawn in the source/drain region constituting the paired switching transistors as in the foregoing example, and also in this example the layout is incapable of avoiding the unbalance of the characteristics of the paired switching transistors that was pointed out as a new problem in the foregoing example.

Further, there is a region in which the isolation extends in along straight line between adjacent active regions 380, longitudinal portions thereof in the direction perpendicular to the longitudinal direction of word line 384 facing to each other. Also in this case the burying of the oxide film is imperfect as in the case of narrow isolation interval, so that a problem of producing a gap in the isolation portion in that direction may occur.

Specifically, in these foregoing examples, though the interval between the isolation regions are made to be constant, the problem of the unbalance of the characteristics of the paired switching transistors occurs.

SUMMARY OF THE INVENTION

The present invention was made in view of the above described problems, and the object of the present invention is to provide a semiconductor memory cell which is capable of simultaneously solving the burying problem of a oxide film in a trench isolation portion as well as the problem of unbalance of characteristics between paired switching transistors. Specifically, the object of the present invention is to provide a semiconductor memory cell in which an isolation oxide film can be buried in a trench for isolating and defining active regions without producing a gap in the oxide film for burying trench isolation portion, and no unbalance of the characteristics of the paired switching transistors occurs in spite of an occurrence of a positional deviation of a word line during manufacturing steps, with a good symmetry of transistor characteristics.

The semiconductor memory cell of the present invention which comprises a pair of switching transistors connected to a bit line through a bit line contact, wherein the pair of switching transistors have respective individual rectangular active regions, and each of the active regions is connected to an extraction electrode which is arranged on a word line beneath the foregoing bit line contact.

In the present invention, the Isolation dielectric film for defining the active regions from each other by a trench isolation is buried in the trench without the occurrence of the gap, and the unbalance of the characteristics of the pair of switching transistors does not occur, if the positional deviation of the word line relative to the active region occurs during the manufacturing step of the word line, resulting in an excellent symmetry of the transistor characteristics.

According to the present invention, though an active region constituting the pair of switching transistors hitherto had been constituted by a single pattern, the two simple rectangular active regions are connected with each other by the extraction electrode formed of polycrystalline silicon in the present invention, so that an interval between the active regions, that is, an isolation interval, can be made to be constant and an overlapping portion of the active regions (close potion) can be made about one-third of the longitudinal length of the active region. Therefore, the dielectric film in the case of usage of the trench Isolation dielectric film for an isolation can be satisfactorily buried in the trench without the occurrence of the gap.

Furthermore, since a signal voltage of the memory cell is decided by a capacitance ratio of a capacitance of the bit line to a capacitance of the capacitor, the signal voltage can be made larger as the capacitor of the bit line is smaller. Therefore, according to constitutions of the active regions and the extraction electrode, the oxide film for the trench isolation is formed under a portion where the extraction electrode extends, so that a parasitic capacitor between the silicon substrate and the extraction electrode is small. Since a connection portion of the bit line contact is the source/drain region directly formed in the silicon substrate in the conventional memory cell structure, a large capacitance produced between the source/drain region and the silicon substrate becomes connected to the bit line. However, in the memory cell structure of the present invention, such situation can be almost perfectly avoided, so that an output signal from the memory cell can be made larger compared to the conventional memory cell structure. Since the extraction electrode is formed on the word line (gate electrode) and the bit line contact is formed on the extraction electrode, a contact depth can be made shallower, and formation of the contact and burying of a conductive material into the contact will be easy, so that a bad conduction is not liable to occur and it is possible to achieve the manufacture of the product with a high yield.

The above and other object, features, and advantages of the present invention will be become apparent from the following description based on the accompanying drawings which illustrate an example of a preferred embodiment of the present invention.

DETAILED DESCRIPTION OF THE PREFERRED EMBODIMENTS

Embodiments of the present invention will be described with reference to the accompanying drawings below. FIG.

Figure 1:
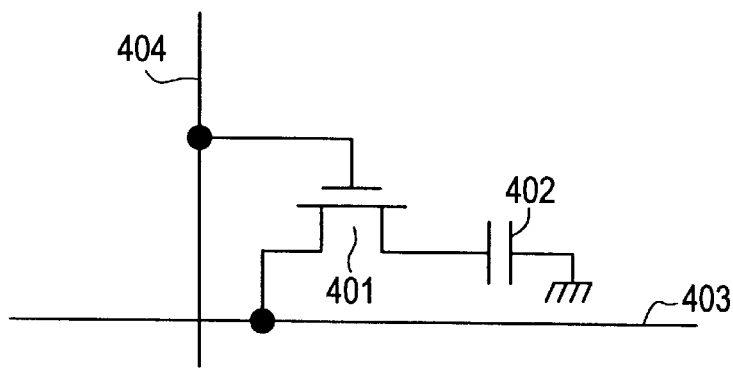
FIG. 1 is a schematic view for explaining a constitution of a general DRAM cell.
Figure 2A:
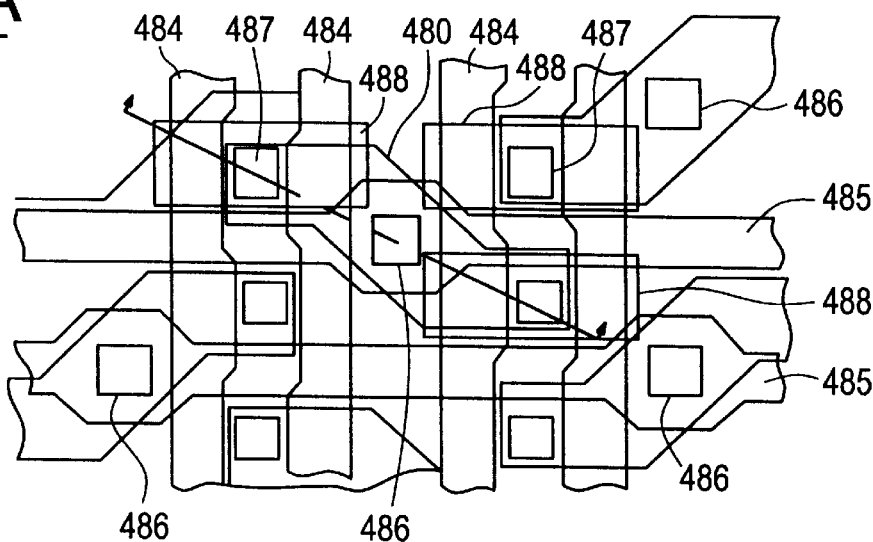
FIG. 2A and FIG. 2B are a plan view and a sectional view, respectively, of an example of a conventional semiconductor memory cell.
Figure 2B:
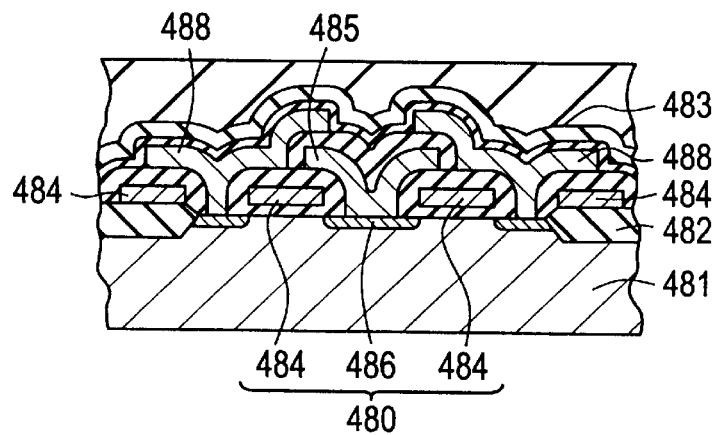
Figure 3:
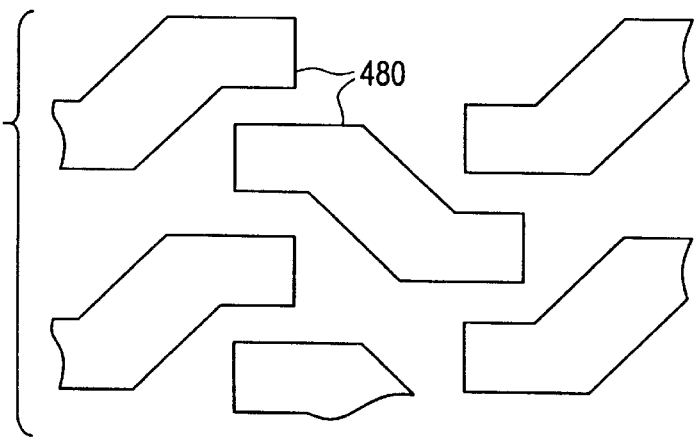
FIG. 3 is a plan view showing a pattern alone of an active region in FIG. 2A.
Figure 4:
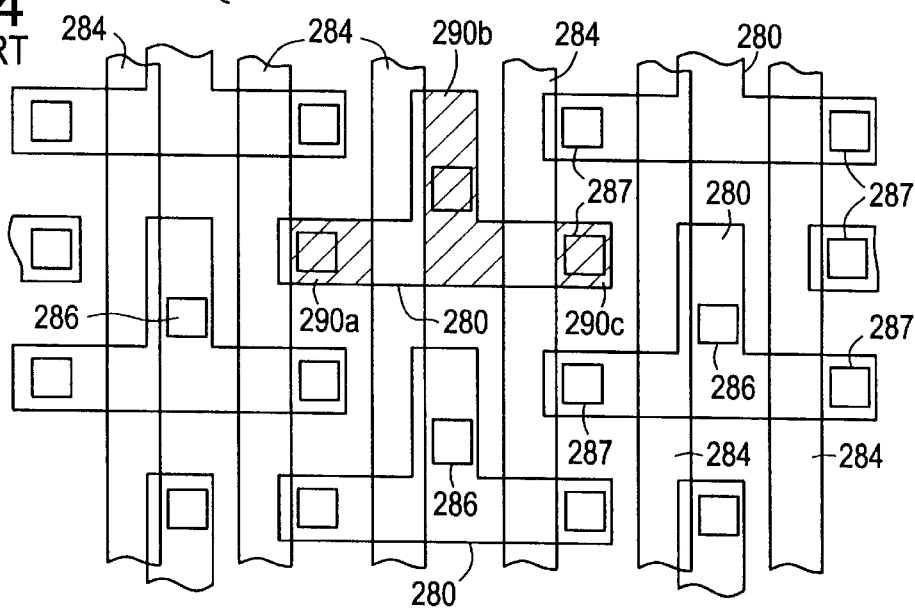
FIG. 4 is a plan view of another conventional semiconductor memory cell.
Figure 5:
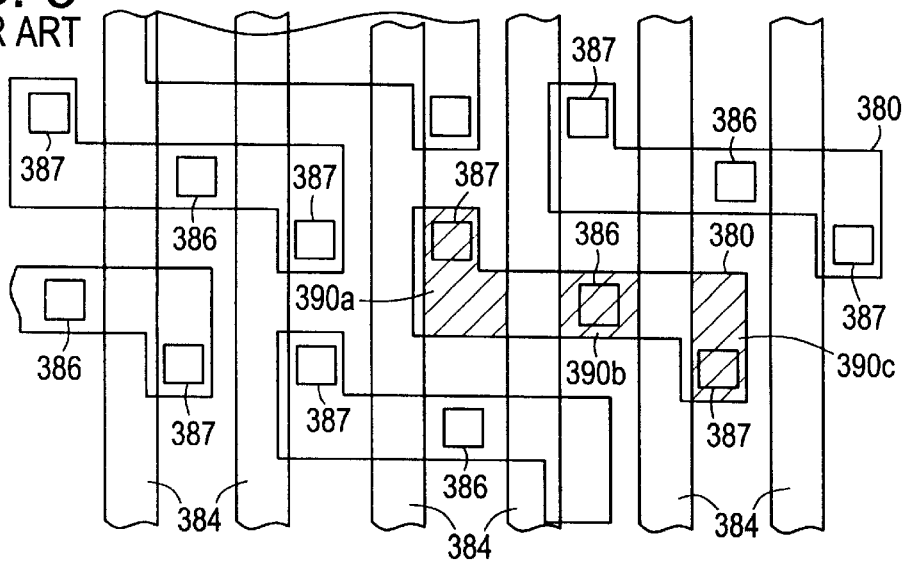
FIG. 5 is a plan view of still another conventional semiconductor memory cell.
Figure 6A:
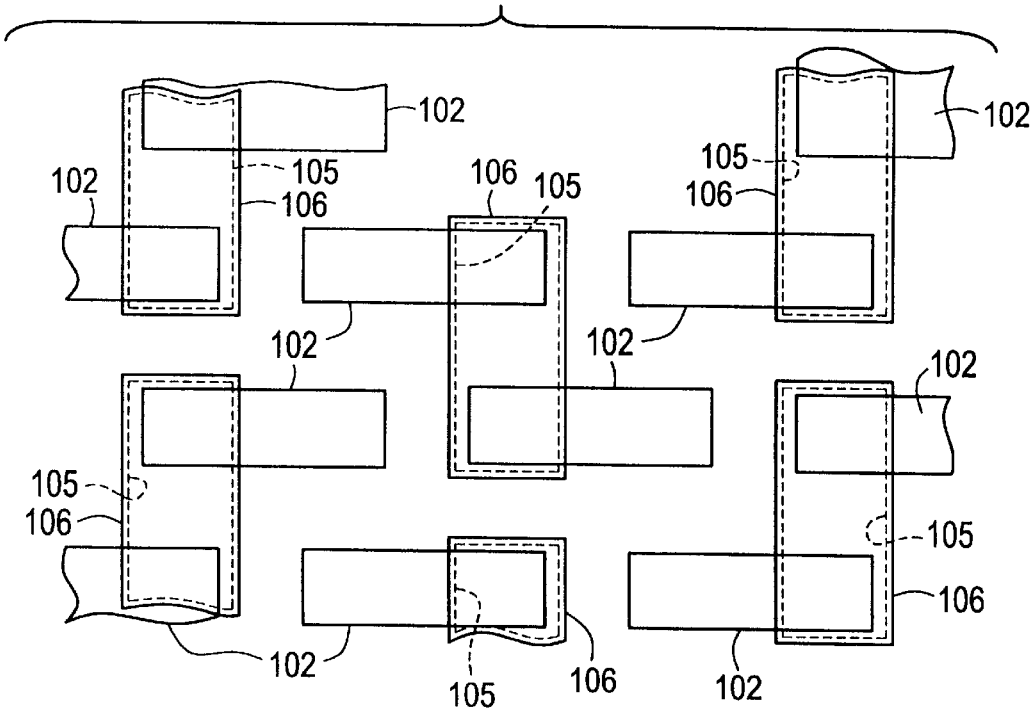
FIG. 6A and FIG. 6B are plan views of a semiconductor memory cell of a first embodiment of the present invention.

6A is a plan view showing a part of an array of a memory cell for explaining a shape and disposition of a semiconductor memory cell according to an embodiment of the present invention, as well as for explaining a shape and disposition of an extraction electrode thereof. Active region 102 constitutes a channel region and a source/drain region of a switching transistor. The active regions constituting a pair of switching transistors are connected by extraction electrode 106. This extraction electrode 106 formed of polycrystalline silicon is buried in extraction electrode contact 105. As shown in FIG. 6A, active regions 102 are arranged at uniform intervals. An overlapped portion of the active regions has no extremely long portion, so that a buried dielectric film for a trench isolation is never locally buried, resulting in no occurrence of a gap in a trench isolation portion.

Figure 6B:
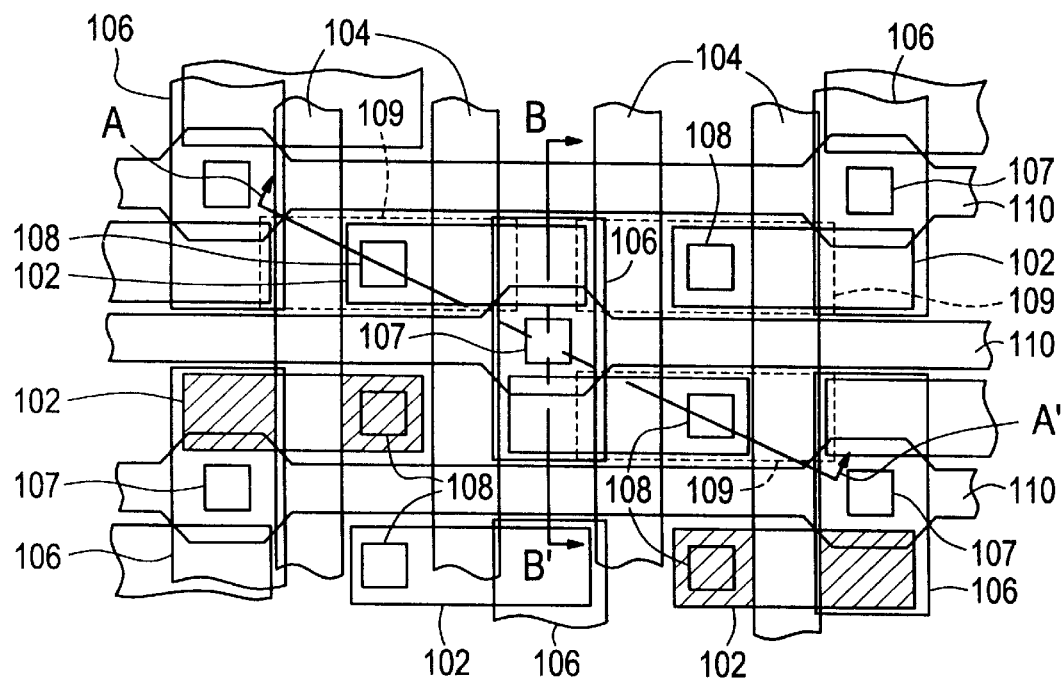

FIG. 6B is a plan view of a cell array for explaining constitution components and positions of the semiconductor memory cell of the present invention. Active region 102 and word line 104 are disposed so as to be approximately perpendicular to each other, and active region 102 which overlaps word line 104 takes a simple rectangular shape, so that the width of the source/drain region putting the word line of the switching transistor is constant, also in the case of the occurrence of the positional deviation of the word line relative to the active region. Thus, characteristics of the switching transistor never becomes worse.

In FIG. 6B, slanted lines are drawn in a portion corresponding to a channel width showing the constant width of the source/drain region. Noted that for easiness of viewing the figure, channel portions of all paired switching transistors are not shown, but utilizing repetitions of the disposition the slanted lines are drawn on the portion corresponding to the pair. Moreover, in FIG. 6B, only three lower capacitor electrodes are illustrated.

Since these switching transistors which make their characteristics unchangeable are connected to each other as the paired switching transistors, the characteristics of the paired switching transistors do not become worse, even though in the case of the occurrence of the positional deviation of the word line relative to the active region, so that the pair of switching transistors exhibiting no characteristic change and no unbalance of the characteristics can be constituted.

Extraction electrode 106 connects the pair of switching transistors, and bit line contact 107 is formed on extraction electrode 106. Extraction electrode 106 and bit line 110 are connected with each other, through bit line contact 107. Lower capacitor electrode contact 108 for connecting the source/drain region of the switching transistor to lower capacitor electrode 109 is disposed between the bit lines.

Figure 7A:
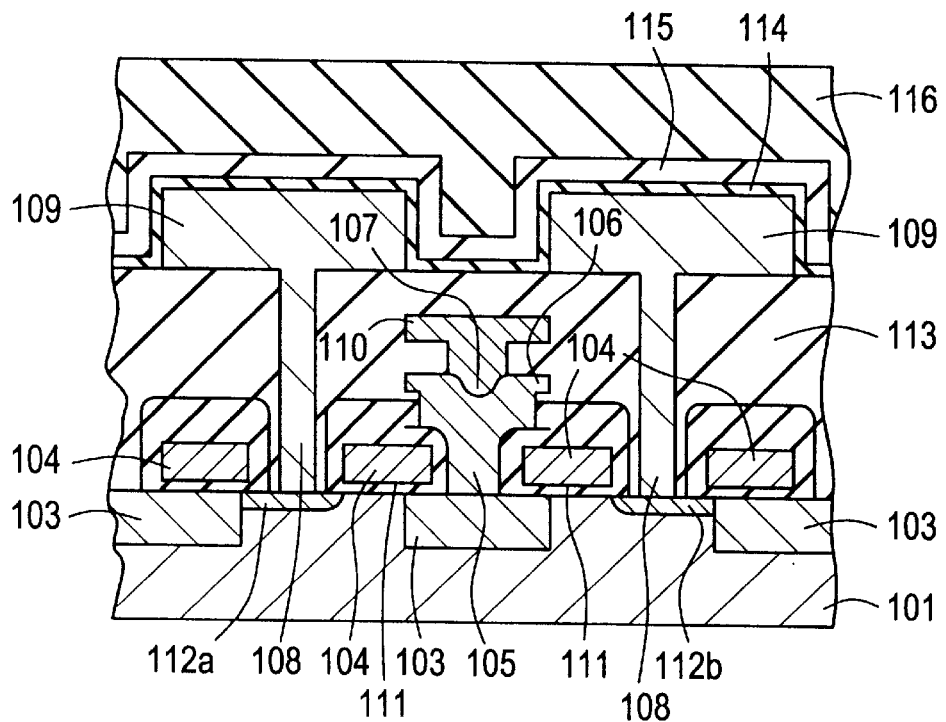
FIG. 7A and FIG. 7B are sectional views of the semiconductor memory cell of the first embodiment of the present invention.
Figure 7B:
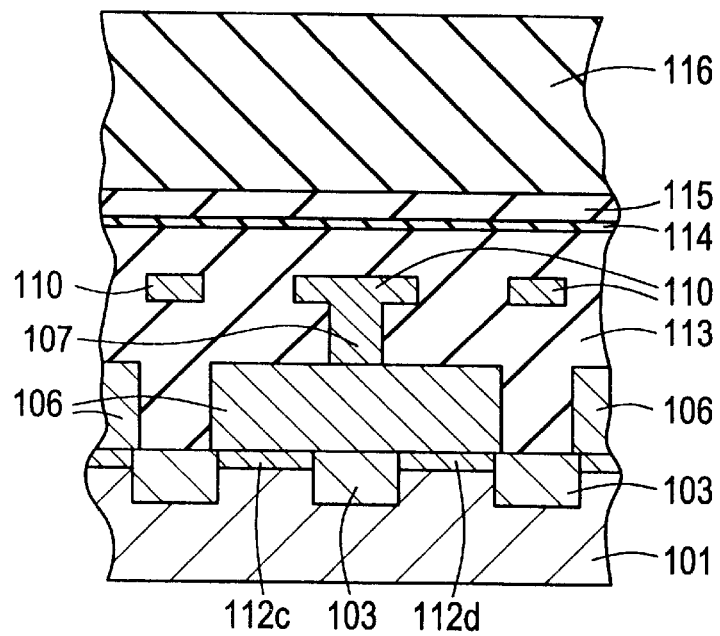

FIG. 7A and FIG. 7B are a sectional view of the semiconductor memory cell taken along the A–A' and B–B', respectively, of FIG. 6B. Referring to FIG. 7A and FIG. 7B, the semiconductor memory cell of this embodiment of the present invention will be further described. Trench isolation dielectric film 103 for defining active region 102 is formed in silicon substrate 101. Source/drain regions 112a, 112b, 112c and 112d constituting the switching transistors are formed on the surface of silicon substrate 101. A capacitor consists of lower capacitor electrode 109 formed on interlayer dielectric film 113 on silicon substrate 101, capacitor dielectric film 114 formed on lower capacitor electrode 109, and cell plate 115 formed on capacitor dielectric film 114. Interlayer dielectric film 116 is formed on cell plate 115.

Next, a sectional structure of a portion of the extraction electrode that is a major point of the present invention will be described with reference to FIG. 7A and FIG. 7B. Trench isolation dielectric film 103 is formed on silicon substrate 101, so that the active region is defined. Word line 104 is formed on silicon substrate 101 via gate dielectric film 111, and extraction electrode contact 105 is formed in a dielectric film (cap dielectric film 120, side wall dielectric film 121 and first interlayer dielectric film 122 in FIG. 8B and FIG. 8C) surrounding this word line 104. Source/drain regions 112c and 112d are connected to extraction electrode 106 by this extraction electrode contact 105. Bit line contact 107 is formed on this extraction electrode 106 so as to penetrate through interlayer dielectric film 113, and extraction electrode 106 and bit line 110 are connected with each other by this bit line contact 107. As shown in FIG. 7B, extraction electrode 106 is connected to source/drain electrodes 112c and 112d, and is disposed so as to extend onto trench isolation dielectric film 103 which is disposed so as to be put between source/drain regions 112c and 112d.

Figure 8A:
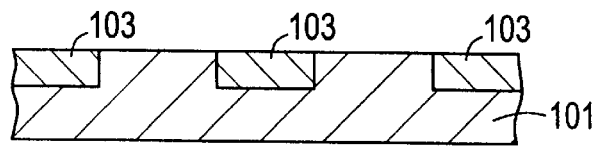
FIG. 8A to FIG. 8E are sectional views showing manufacturing steps of the semiconductor memory cell, respectively, of the first embodiment.

Next, referring to FIG. 8A to FIG. 8E, a manufacturing method of the semiconductor device of the first embodiment of the present invention will be described. Noted that a design rule and manufacturing steps are based on assuming 0.18 µm. FIG. 8A to FIG. 8E are a schematic section view taken along the line A–A' of FIG. 6B. At first, as shown in FIG. 8A, isolation dielectric film 103 by a known trench isolation, for example, is formed on P-type silicon substrate 101. A depth of this trench is about 200 nm, for example. A non-doped oxide film (NSG) deposited using a plasma CVD method and/or LP-CVD method preferably is used for buried oxide film. Moreover, after the foregoing oxide film for use in burying is grown, burying of the oxide film in the trench is completed using a CMP (Chemical Mechanical Polishing) technology.

Figure 8B:
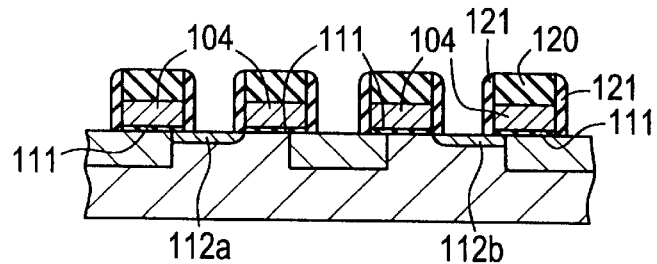

Next, as shown in FIG. 8B, gate oxide film 111 having a film thickness of about 7 nm in terms of a silicon oxide film is formed by thermal oxidation. Then, an N type polycrystalline silicon film is deposed to a thickness of bout 70 nm. Next, a tungsten silicide (WSi) film is deposited to a thickness of about 100 nm. Moreover, an oxide film is deposited to a thickness of about 150 nm, and, thereafter, the foregoing nitride film, WSi film, and polycrystalline silicon film are patterned by a photolithography step and an etching step, cap dielectric film 120 and word line 104 consisted of polycrystalline silicon film and a WSi film are formed. Widths of cap dielectric film 120 and word line 104, that is, a gate length, is 0.18 µm. The material of word line 104 is the foregoing polycrystalline silicon and WSi, but titanium silicide (TiSi) or tungsten (W) may be used instead of WSi, which are capable of reducing a resistivity of word line 104.

Next, an oxide film is grown to a thickness of about 60 nm, and etchback by a dry etching to the oxide film is carried out, so that a side wall dielectric film 121 is formed on the side wall of word line 104. An N⁻type diffusion layer is formed by an ion implantation using word line 104 and side wall dielectric film 121 for masking. This ion implantation may be carried out after the formation of word line 104, or may be carried out both after the formation of the word line and after side wall dielectric film. The time of the ion implantation may be appropriately selected for securing a desired transistor characteristic. By this N⁻type diffusion layer source/drain regions 112a, 112b, 112c and 112d are formed.

Figure 8C:
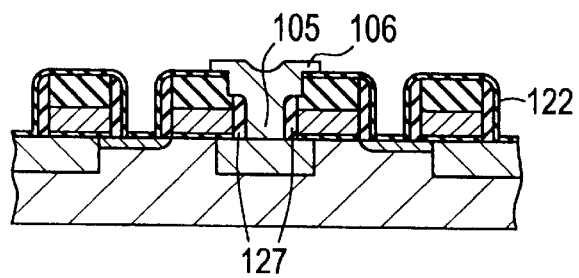

Next, as shown in FIG. 8C, a non-doped oxide film (NSG) serving as a first interlayer dielectric film 122 is grown to a thickness of about 25 nm. In this situation, extraction electrode contact 105 is formed by perforating first interlayer dielectric film 122 by a photolithography step and an etching step, and thereafter, a polycrystalline silicon into which N type impurities are introduced is deposited, followed by formation of extraction electrode 106 by a photolithography step and an etching step.

As described above, cap dielectric film 120 and side wall dielectric film 121 are consisted of the oxide film. When cap dielectric film 120 and side wall dielectric film 121 are formed by a nitride film, the following advantages are brought about, therefore, formation by a nitride film is suitable for forming the semiconductor memory cell. Specifically, first interlayer dielectric film 122 formed by the oxide film, cap dielectric film 120 formed by the nitride film, and side wall dielectric film 121 formed by the nitride film can be etched with a suitable selective etching rate among them, so that extraction electrode contact 105 can be perforated in a good condition with controlling a reduction in a film thickness of cap dielectric film 120.

Figure 8D:
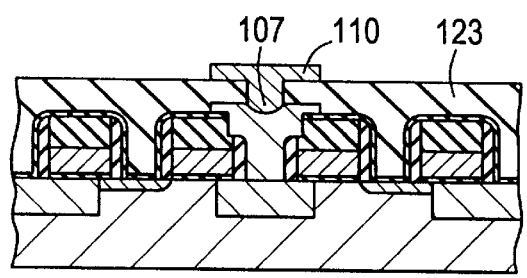

Subsequently, as shown in FIG. 8D, second interlayer dielectric film 123 formed of either a stacked film composed of a non-doped oxide film (NSG) and boron phosphorous silicate glass (BPSG) or a single film formed of one of them is formed. Thereafter, an opening for bit line contact 107 is perforated in second interlayer dielectric film 123 so as to expose a part of a upper surface of extraction electrode 106, and a N type polycrystalline silicon film is deposited to a thickness of about 80 nm. Next, tungsten silicide (WSi) film is deposited to a thickness of about 100 nm, and, thereafter, the WSi film is patterned to a shape of bit line 110 by a photolithography step and an etching step.

Figure 8E:
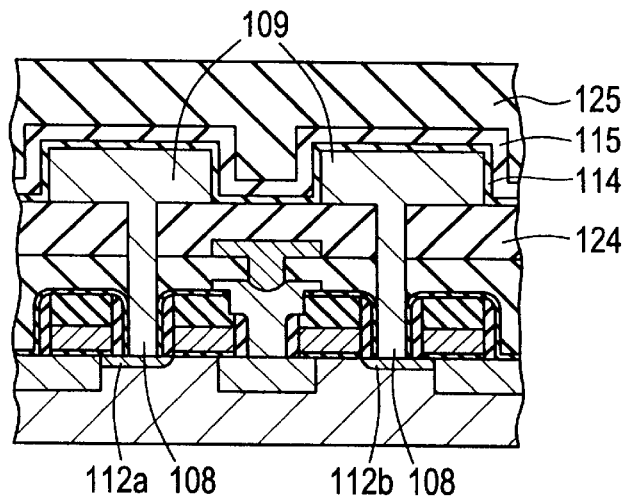

Subsequently, as shown in FIG. 8E, a stacked film composed of a non-doped oxide film (NSG) and boron phosphorous silicate glass (BPSG) is formed, and this stacked film serves as third interlayer dielectric film 124. Thereafter, holes for lower capacitor electrode contact 108 are opened in second interlayer dielectric film 123 and third interlayer dielectric film 124 so as to expose each of source/drain regions 112a and 112b. Next, an N type polycrystalline silicon film is deposited to a thickness of about 80 to 100 nm, and this film is processed to a shape of lower capacitor electrode 109 by using a photolithography technology and an etching technology.

Thereafter, capacitor dielectric film 114 of composed of a stacked film constituted by an oxide film and a nitride film is grown to a thickness of about 4.5 to 5 nm in terms of an oxide film. Also a dielectric film typified by a tantalum oxide film ($Ta_2O_5$) may be employed to capacitor dielectric film 114. It is more advantageous in terms of security of a cell capacitor that this high dielectric film is employed. Furthermore, when such high dielectric film is employed as a capacitor dielectric film, a good property of this film such as a leak current of this film can be achieved. When a stacked film composed of an oxide film and a nitride film is used as the capacitor dielectric film, a N type polycrystalline silicon film can be used for materials of lower capacitor electrode 109 and cell plate 115. Moreover, when, for example, a tantalum oxide film ($Ta_2O_5$) is used for the capacitor dielectric film, a N type polycrystalline film can be used for lower capacitor electrode 109, and either a stacked film composed of a TiN film and a WSi film or a stacked film composed of a TiN film and a polycrystalline silicon film can be used for the cell plate. After cell plate 115 is subjected to a patterning treatment (shape working), a stacked film composed of a non-doped oxide film (NSG) and boron phosphorous silicate glass (BPSG) is formed as the fourth interlayer dielectric film 125.

Furthermore, as a whole of the DRAM chip, formations of a contact hole (not shown) and a metal wiring are iterated several times, thus the DRAM is completed.

Figure 9A:
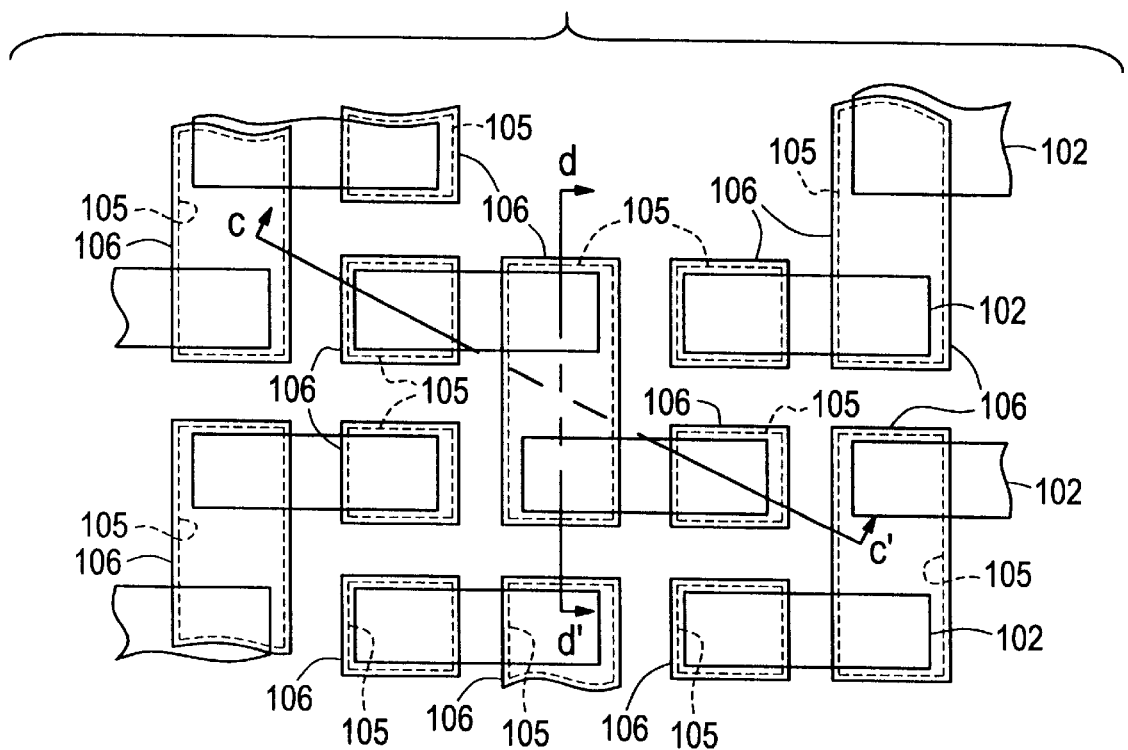
FIG. 9A is a plan view of a semiconductor memory cell of a second embodiment of the present invention.
Figure 9B:
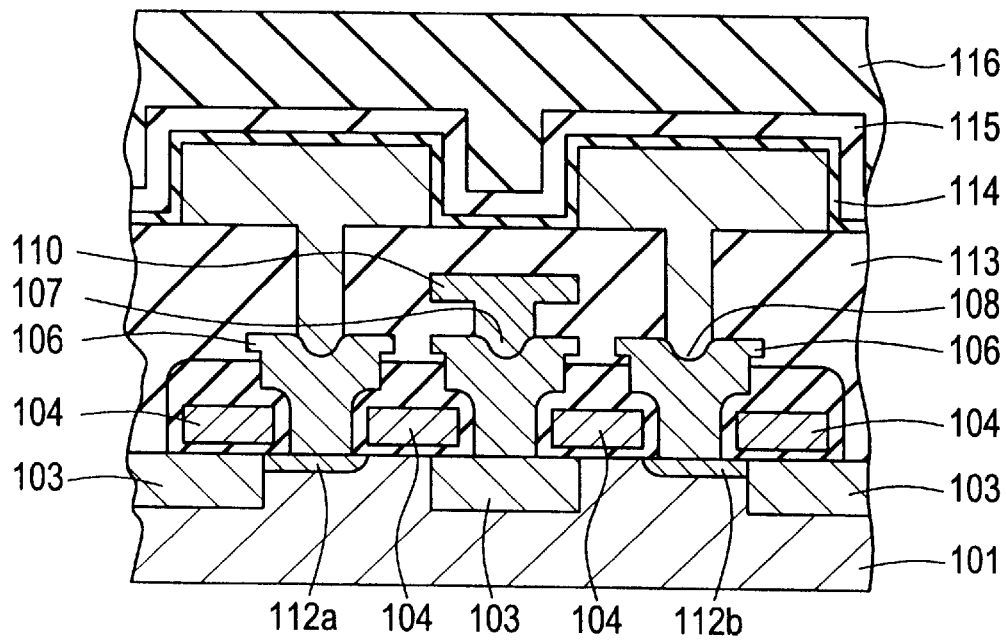
FIG. 9B and FIG. 9C are sectional views of the semiconductor memory cell of the second embodiment of the present invention.
Figure 9C:
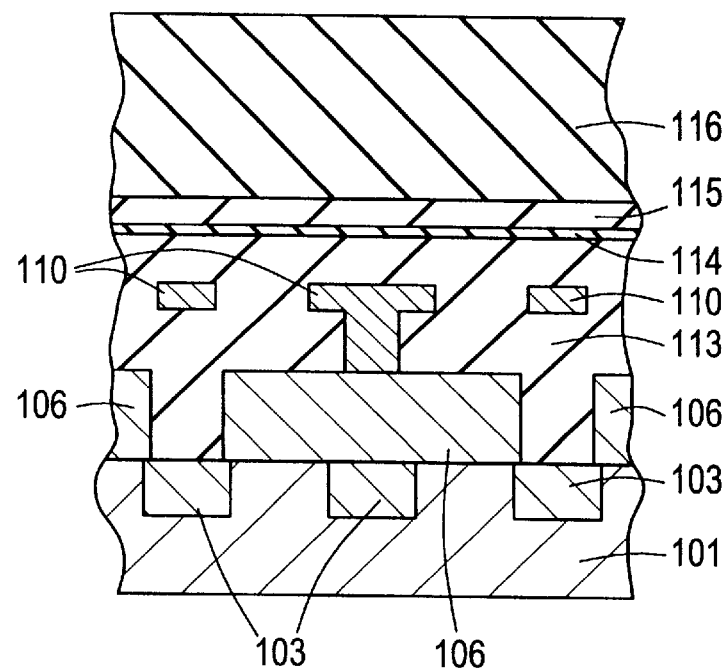

Next, a second embodiment of the present invention will be described. In this embodiment, a plan view is the similar as those of FIG. 6A and FIG. 6B used for the descriptions of the first embodiment, and the same components as those of FIG. 6A and FIG. 6B are denoted by the same reference numerals as those of FIG. 6A and FIG. 6B. FIG. 9A is a plan view of a semiconductor memory cell of the second embodiment, and FIG. 9B and FIG. 9C are a sectional view of the semiconductor memory cell of the second embodiment. FIG. 9B is a sectional view taken along the line c–c' of FIG. A, and FIG. 9C is a sectional view taken along the line d–d' of FIG. 9A.

The second embodiment differs from the first embodiment in that in the first embodiment, extraction electrode 106 is disposed beneath bit line contact 107 (see FIGS. 6A and 6B) only for the purpose of connecting the active regions, however, in the second embodiment extraction electrode 106 is disposed also under lower capacitor electrode 108 as is apparent from FIGS. 9A, 9B and 9C.

With such structure of the semiconductor memory cell, while the depth of the lower capacitor electrode contact must be deepened in the first embodiment, the depth of the lower capacitor electrode contact can be made shallower by disposing the extraction electrode also beneath the lower capacitor electrode contact in this embodiment, resulting in more easiness of the formation of the semiconductor memory cell.

Furthermore, also the lower capacitor electrode contact is formed on the extraction electrode in the second embodiment, so that the same effect as that rising from the formation of the foregoing bit line contact can be achieved.

It is to be understood, however, that although the characteristics and advantages of the present invention have been set forth in the foregoing description, the disclosure is illustrative only, and changes may be made in the arrangement of the parts within the scope of the present appended claims.

What is claimed is:

1. A pair of semiconductor memory cells comprising:
   a pair of switching transistors, each of said pair of switching transistors being connected to a bit line through a bit line contact;
   wherein each of said pair of switching transistors has a rectangular active region independent from the other, and said active region is connected to an extraction electrode disposed on a word line, beneath said bit line contact,
   wherein the extraction electrode is formed on trench isolation dielectric films so as to be laid across said trench isolation dielectric films, and said trench isolation dielectric films are formed in a surface of a substrate between source/drain regions of said active regions.

2. A pair of semiconductor memory cells comprising:
   a pair of switching transistors, each of said pair of switching transistors being connected to a bit line through a bit line contact,
   wherein said semiconductor memory cells have two rectangular active regions disposed at uniform intervals, each of said rectangular active regions constituting channel regions and source/drain regions of said switching transistors;
   word lines disposed so as to be perpendicular to each of said active regions; and
   extraction electrode formed in contact with the active regions constituting said pair of switching transistors and connected to said bit line by said bit line contact, wherein the extraction electrode is formed on trench isolation dielectric films so as to be laid across said trench isolation dielectric films, and said trench isolation dielectric films are formed in a surface of a substrate between said source/drain regions.

3. A pair of semiconductor memory cells comprising:

a pair of switching transistors, each of said pair of switching transistors being connected to a bit line through a bit line contact;

wherein each of said pair of switching transistors has a rectangular active region independent from the other, and said active region is connected to an extraction electrode disposed on a word line, beneath said bit line contact, wherein bit lines, extraction electrodes and word lines are buried in dielectric films, said semiconductor memory cells have lower capacitor electrodes formed on said interlayer dielectric films, and lower capacitor electrode contacts formed in said interlayer dielectric films for connecting in said interlayer dielectric films for connecting said lower capacitor electrodes to source/drain regions, wherein the extraction electrode is formed on trench isolation dielectric films so as to be laid across said trench isolation dielectric films, and said trench isolation dielectric films are formed in a surface of a substrate between said source/drain regions.

4. The pair of semiconductor memory cells according to claim 3, wherein a second extraction electrode is disposed beneath at least one of said lower capacitor electrode contacts to electrically connect said lower capacitor electrodes to said source/drain regions.

5. A pair of semiconductor memory cells comprising:

a pair of switching transistors, each of said pair of switching transistors being connected to a bit line through a bit line contact, wherein said semiconductor memory cells have two rectangular active regions disposed at uniform intervals, each of said rectangular active regions constituting channel regions and source/drain regions of said switching transistors;

word lines disposed so as to be perpendicular to each of said active regions; and extraction electrode formed in contact with the active regions constituting said pair of switching transistors and connected to said bit line by said bit line contact, wherein bit lines, extraction electrodes and word lines are buried in dielectric films, said semiconductor memory cells have lower capacitor electrodes formed on said interlayer dielectric films, and lower capacitor electrode contact formed in said interlayer dielectric films for connecting in said interlayer dielectric films for connecting said lower capacitor electrodes to source/drain regions, wherein the extraction electrode is formed on trench isolation dielectric films so as to be laid across said trench isolation dielectric films, and said trench isolation dielectric films are formed in a surface of a substrate between said source/drain regions.

6. The pair of semiconductor memory cells according to claim 5, wherein a second extraction electrode is disposed beneath at least one of said lower capacitor electrode contacts to electrically connect said lower capacitor electrodes to said source/drain regions.

* * * * *